United States Patent [19]

Bubash

[11] Patent Number: 5,015,944
[45] Date of Patent: May 14, 1991

[54] CURRENT INDICATING DEVICE

[76] Inventor: James E. Bubash, 252 Sunset Dr., St. Louis, Mo. 63011

[21] Appl. No.: 349,986

[22] Filed: May 8, 1989

Related U.S. Application Data

[63] Continuation of Ser. No. 940,730, Dec. 10, 1986, abandoned, which is a continuation-in-part of Ser. No. 643,839, Aug. 23, 1984, abandoned, which is a continuation of Ser. No. 283,489, Jul. 15, 1981, abandoned.

[51] Int. Cl.$^5$ .......................... G01R 1/20; G01R 19/15
[52] U.S. Cl. ........................................ 324/127; 324/96; 324/133; 340/664
[58] Field of Search ................. 324/127, 133, 96, 102, 324/72; 340/644, 664; 336/90

[56] References Cited

U.S. PATENT DOCUMENTS

| | | | |
|---|---|---|---|
| 2,452,060 | 10/1948 | Klemperer | 340/664 |
| 2,644,135 | 6/1953 | Schnoll | 336/90 |
| 3,684,955 | 8/1972 | Adams | 324/72 |
| 4,100,487 | 7/1978 | Wojtasinski et al. | 324/96 |

FOREIGN PATENT DOCUMENTS 0063264  5/1981  Japan .................................. 324/127

OTHER PUBLICATIONS

SC-107B Silectron Cores; Document pub. by The Arnold Engineering Co., Marengo, Ill., pp. 3, 37, 38, no date.

Primary Examiner—Ernest F. Karlsen
Attorney, Agent, or Firm—Polster, Polster and Lucchesi

[57] ABSTRACT

A unitary, self-contained device for sensing and signalling the flow of current through a conductor includes a toroidal coil of electrically conductive wire having two ends, and an illuminating device electrically connected to the two ends of the wire, responding to a level of current passing through the conductor by producing apparently continuous light.

5 Claims, 3 Drawing Sheets

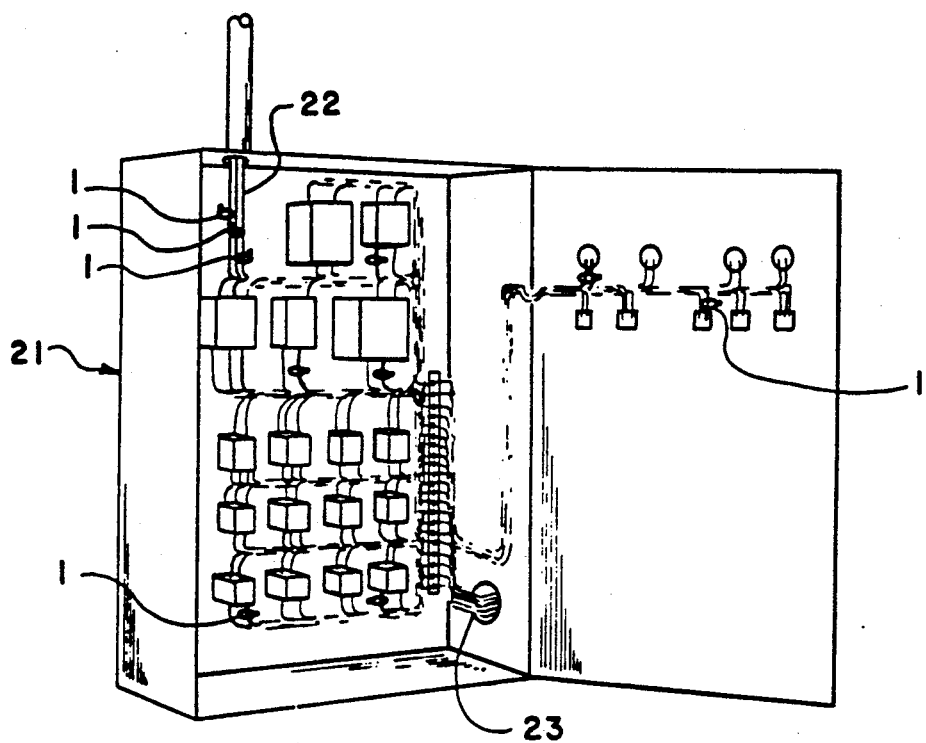
FIG 2
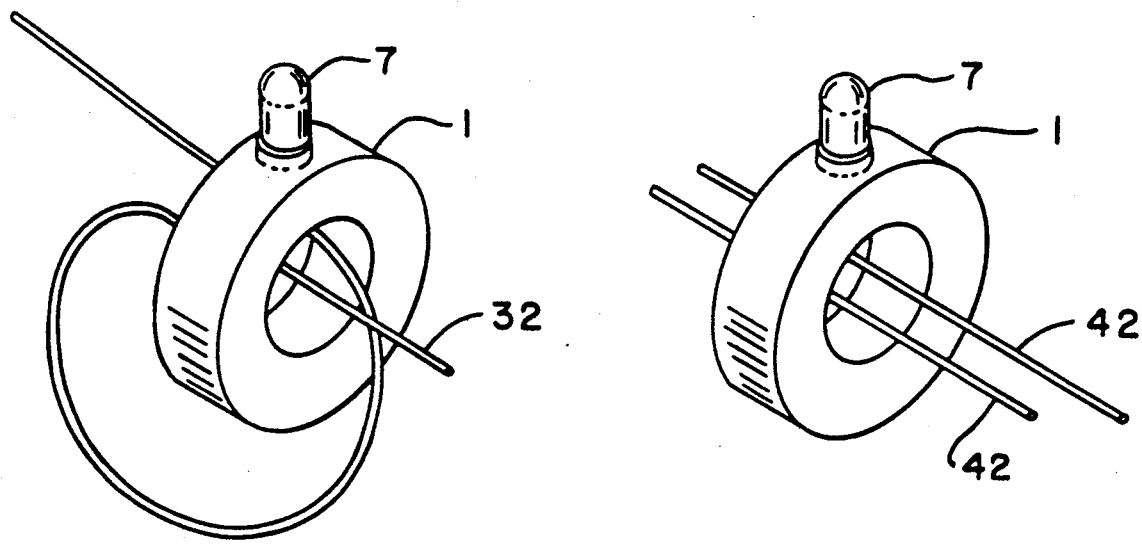
FIG 3
FIG 4

CURRENT INDICATING DEVICE

CROSS REFERENCE TO RELATED APPLICATION

This application is a continuation of Ser. No. 940,730, filed Dec. 10, 1986, now abandoned, which is a continuation in part of application Ser. No. 643,839, filed Aug. 23, 1984, now abandoned, which is a continuation of application Ser. No. 283,489, filed July 15, 1981, now abandoned.

BACKGROUND OF THE INVENTION

Toroidal coils are common articles of commerce. They are used as transformers, inductors and chokes in electronic circuits. Forms of toroidal coils have been used as integrating and differential transformers (Butow U.S. Pat. No. 1,866,751, Knopp U.S. Pat. No. 1,141,642), meter probes (Quietzsch et al U.S. Pat. No. 4,100,488, Adams U.S. Pat. No. 3,684,955), for high voltage current measurement (Kashiwa Japanese patent No. 63,264), indicating devices for welding systems (Klemperer, U.S. Pat. No. 2,452,060) and devices for monitoring current wave forms produced by lightning strikes (Wojtasinski et al. U.S. Pat. No. 4,100,487). None, however, has been a self-contained unit.

These prior art devices are no doubt effective for their particular applications, but they tend to be complicated or adapted to a limited particular use.

One of the objects of this invention is to provide a current indicating device which is inexpensive, has a multiplicity of applications, and provides a ready means for determining fault conditions, among other uses.

Other objects will become apparent to those skilled in the art in the light of the following description and accompanying drawing.

SUMMARY OF THE INVENTION

In accordance with this invention, generally stated, a self-contained, unitary device for sensing and signalling the flow of current through a conductor is provided in the form of a toroidal coil for mounting closely on at least one conductor. The coil is continuous intermediate two ends. An illuminating device is electrically connected to the two ends of the coil and is mounted with the coil, so that the device can easily be slipped onto a conductor. The coil is wound on a magnetically conductive annular core, and the coil and the base portion of the signalling device, such as an incandescent lamp or a light-emitting diode, are encapsulated in a molded housing.

BRIEF DESCRIPTION OF THE DRAWINGS

In the drawing.

FIG. 2 is a view in perspective of a control cabinet showing the device of FIG. 1 mounted on critical machine control conductors;

FIG. 3 is a view in perspective of the device of FIG. 1 mounted on a conductor looped through the device;

FIG. 4 is a view in perspective of the device of FIG. 1 mounted on parallel conductors;

DESCRIPTION OF THE PREFERRED EMBODIMENTS

Figure 1:
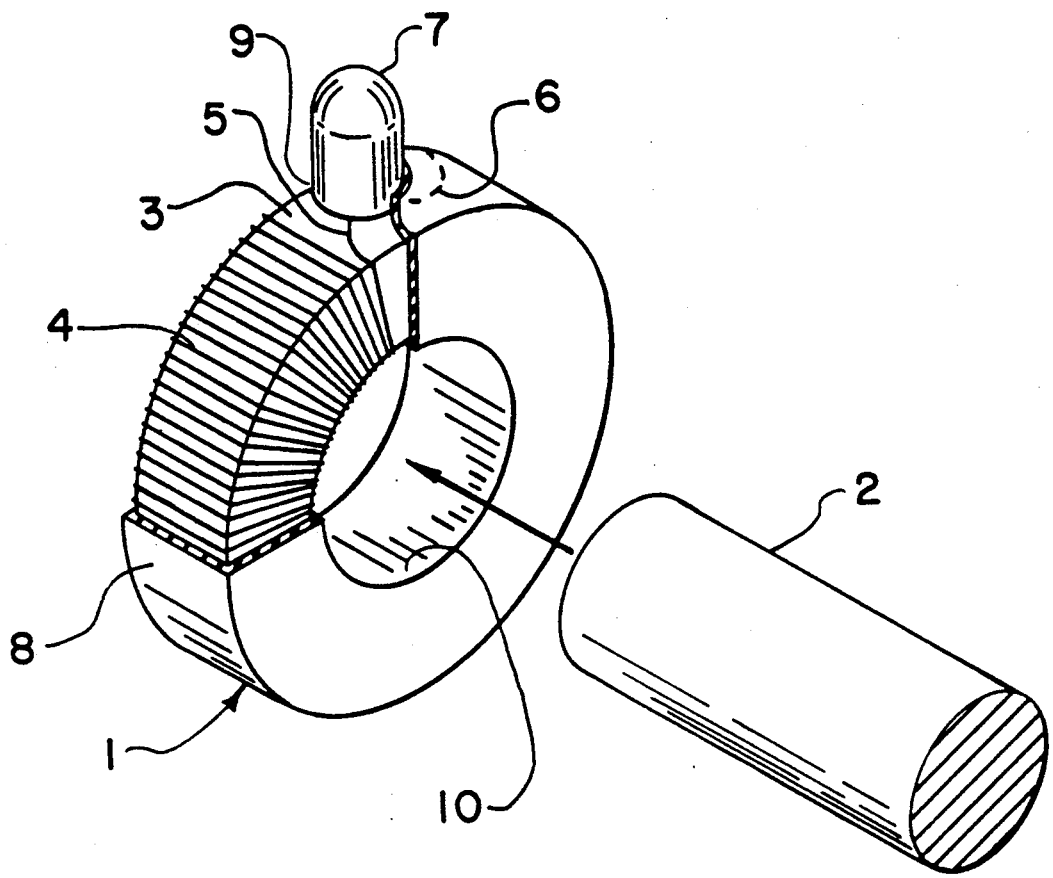
FIG. 1 is a view in perspective, partly cut away, of one embodiment of current indicating device of this invention, with a simple circuit diagram.
Figure 1:
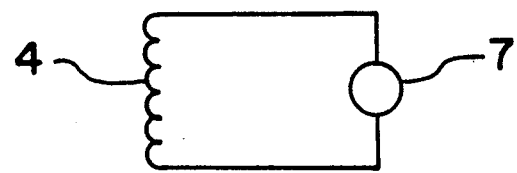

Referring now to the drawing, and particularly to FIG. 1, reference numeral 1 indicates one illustrative embodiment of device of this invention in the process of being mounted on an electrical conductor 2. The device 1 includes an annular core 3 of magnetically conductive material, such as ferrite, a toroidal coil 4 of electrically conductive wire, with two ends 5 and 6, an illuminating device or lamp 7, which, in the illustrative embodiment shown, is a light emitting diode, and a molded housing 8. The LED has the usual terminals, which are electrically connected to ends 5 and 6 of the coil. The housing 8 is of electrically insulating material, and, as indicated, encapsulates not only coil 4 but a base portion 9 of the lamp 7, mounting the lamp 7 firmly to the core 3, and making the device completely self-contained and unitary. An inner, cylindrical wall 10 of the housing 8 defines a cylindrical opening which is of a size to admit the conductor 2. The term "self-contained" is applied to both of the embodiments described to indicate that the coil, lamp and any elements of a lamp circuit are mounted together and can be handled, stored, shipped and mounted as a unit, without external connections.

The circuit diagram of FIG. 1 is believed to be self-explanatory.

Merely by way of illustration, in the embodiment of the device shown in FIG. 1, the core 3 can be a one-piece annulus of ferrite with an O.D. of 0.50 inches and an I.D. of 0.30 inches, 0.20 inches thick in the axial direction, the coil 4, 370 turns of No. 39 wire, the lamp 7, a size T 1¾ LED, and the housing, epoxy resin, 0.02 inches thick throughout. Such a device, mounted on a 60 Herz alternating current-carrying conductor of a slightly smaller diameter than the I.D. of the device, will signal, by causing the LED to glow, at a current flow of 10 to 18 amps. The use of a greater number of turns a more magnetically sensitive material for the core, or a more sensitive LED will reduce the threshhold value of the current.

Referring now to FIG. 2, reference numeral 21 indicates a control cabinet which, for purposes of illustration, includes supply leads 22 from a 3-phase source not here shown, various switches, relays and motor starters mounted on a rear panel, and instruments mounted on a door, electrically connected mediately or immediately to the supply leads 22, and output leads 23 electrically connected to various of the controls. Devices 1 are mounted on critical machine control wires, so that in the event a machine stops or, if the machine is at a distance, if it is desired to determine if it is operating, it will be immediately apparent, when one opens the control cabinet, that current is or is not flowing in a wire.

Referring now to FIGS. 3 and 4, in FIG. 3 a conductor 32 is looped through a device 1 effectively to double the sensitivity of the device. In FIG. 4, a device 1 is mounted on a pair of parallel conductors 42. This arrangement can be used, for example, to indicate a current flow imbalance, to serve as a ground-fault indicator.

Figure 5:
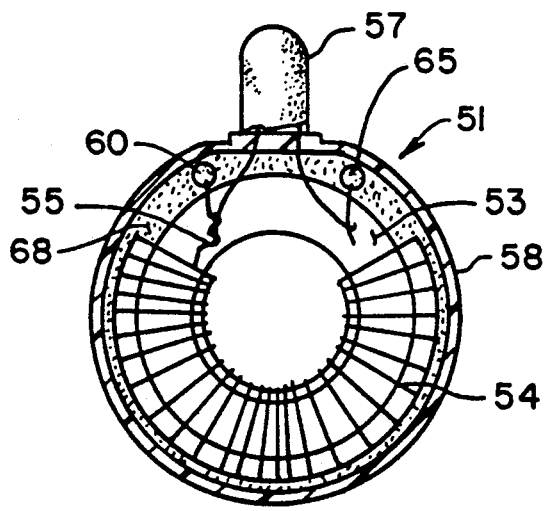
FIG. 5 is a view in front elevation, with the front part of a housing cut away, of another embodiment of device of this invention.

Referring now to FIG. 5, a preferred embodiment of device 51 is shown. In this embodiment, LED 57 can be used, that operates on about 2 volts. An annular core 53, and toroidal coil 54, with ends 55 and 56, a housing 58, which, in this embodiment is made up of two, structurally mirror image shells 59, and an epoxy potting and securing material 68 all have substantial counterparts in the first embodiment described.

In this second embodiment, to accommodate the LED 57, an LED circuit is provided, in this embodiment consisting of a zener diode 60, connected across the ends 55 and 56 of the coil in parallel with the LED, and a resistor 65, electrically connected in series with the LED between the zener diode and the LED. The resistor, in this illustrative embodiment, can be a 40 ohm, ¼ watt resistor. The lamp 57 can be an HLMP 3300, red, T 1¾ LED, available from Hewlett Packard or General Instrument. The zener diode 60 can be a 1N5229 zener diode, rated at 4.3 volts, 500 milliwatts. In this embodiment the coil is made up of 240 (+/−10) turns of 34 AWG magnet wire, on a tape wound core 53, 3% silicon, ½ inch I.D. by 182 inch O.D. by ¼ inch thick. In this particular embodiment, the housing 58 is made up of two, mirror image, cup shaped, injection molded plastic shells, and the coil, zener diode, resistor, and base of the LED, are potted and the two halves of the housing secured by the epoxy resin 68. Alternatively, the two halves of the housing can be adhered along their mating surfaces with another or additional adhesive.

The value of the resistor is such as to drop the voltage from 4.3 to 2.2 volts through the LED. The zener diode 60, in parallel with the LED 57, limits the voltage supplied the LED. It is, of course, important that the zener diode 60 be oriented properly with respect to the LED 57.

Figure 6:
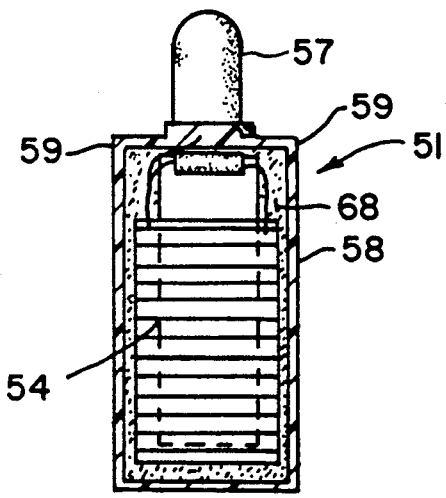
FIG. 6 is a view in edge elevation, with a side part of the housing cut away, of the embodiment shown in FIG. 5.
Figure 7:
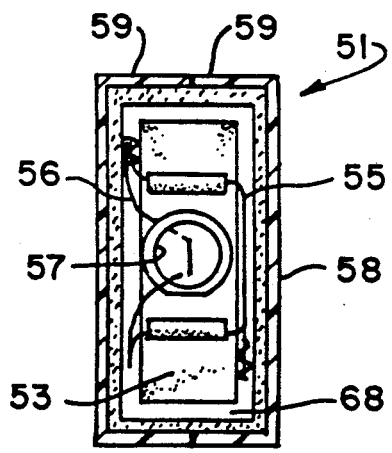
FIG. 7 is a top plan view, with a top part of the housing cut away, of the embodiment shown in FIG. 5.
Figure 8:
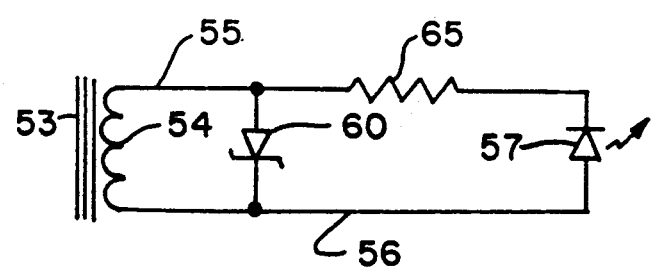
FIG. 8 is a view of a circuit diagram of the embodiment of device shown in FIGS. 5-7.

Numerous variations in the construction of the device of this invention, within the scope of the appended claims, will occur to those skilled in the art in the light of the foregoing disclosure. Merely by way of example, the core can be cut out to accommodate the zener diode and resistor, or the housing can be shaped to accomodate the zener diode and resistor, leaving the core circular in front elevation. Although the two halves of the housing in the preferred embodiment are structurally mirror images, they may have different indicia on them, for example. The housing can be molded in place in the second embodiment, or made in different ways. The type of illuminating device can be changed to accommodate different sizes of conductors, and different voltages and frequencies carried by the conductor. Two lamps can be used, as illustrated in FIG. 6 of the parent case, or the core can be hinged, as illustrated in FIG. 10 of that case, or the illuminating device can take the form of a liquid crystal, as illustrated in FIG. 15, or the device can be arranged to be panel mounted, as illustrated in FIG. 14 of the parent, or a variable resistance device can be mounted on the core or housing as illustrated in FIG. 5 of the parent. Multiple cores can be used within a single housing to accomodate multiple conductors. Another electronic circuit mounted on the coil or housing and powered by the current induced in the coil itself can be used to produce a flashing signal, for example. These are merely illustrative.

I claim:

1. A self-contained current indicating device permanently mounted on an electrical conductor for signalling the flow of current through said conductor by giving an apparently constant visual signal when current above a predetermined minimum is flowing through said conductor, comprising a toroidal core with an opening through its center; an electrically conductive wire wound on and around the said toroidal core with a reach of each full turn of said wire passing through said central opening and leaving a conductor-receiving central opening therein, said coil having two ends, and elongated illuminating means electrically connected to said two ends of said coil wire, said illuminating means being carried by and mounted on said wound core, an encapsulating housing surrounding said coil and a part of said illuminating means, the rest of said illuminating means projecting radially outwardly from said encapsulating housing to be continuously visible to a viewer, said conductor-receiving central opening being of a size to admit said conductor, said illuminating means being energized above a predetermined level of current passing through said conductor to provide an apparently constant visual signal, said illuminating means and coil constituting a single, unitary, mechanical package without external electrical connection.

2. The device of claim 1 wherein the illuminating means is electrically connected mediately to the two ends of the coil wire.

3. A self-contained current indicating device for signalling the flow of current through a conductor by giving an apparently constant visual signal when current above a predetermined minimum is flowing through said conductor, comprising a toroidal core with an opening through its center; an electrically conductive wire wound on and around the said toroidal core with a reach of each full turn of said wire passing through said central opening and leaving a conductor-receiving central opening therein, said coil having two ends; an elongated light emitting diode electrically connected to said two ends of said coil wire; and a light emitting diode circuit comprising a Zener diode electrically connected to said two ends of said coil wire in parallel with said Zener diode and resistance means connected in series with said light emitting diode between said Zener diode and said light emitting diode, said light emitting diode being carried by and mounted on said wound core, said core, coil, all of the elements of the light emitting diode circuit and the base of the light emitting diode being enclosed in a housing, the remainder of said light emitting diode projecting radially from said housing to be continuously visible to a viewer, said conductor-receiving central opening being of a size to admit said conductor, said light emitting diode being energized above a predetermined level of current passing through said conductor to provide an apparently constant visual signal, said light emitting diode, light emitting diode circuit and coil constituting a single, unitary, mechanical package without external electrical connection.

4. The device of claim 3 wherein the housing is made up of two, structurally mirror image shells, the core, coil, light emitting diode circuit and base of the light emitting diode are potted in resin, and the shells of the housing are secured therearound.

5. The device of claim 3 wherein the core is a tape wound core.

* * * * *

UNITED STATES PATENT AND TRADEMARK OFFICE
CERTIFICATE OF CORRECTION

PATENT NO. : 5,015,944
DATED : May 14, 1991
INVENTOR(S) : James E. Bubash

It is certified that error appears in the above—identified patent and that said Letters Patent is hereby corrected as shown below:

Column 3, line 23 delete "182 inch O.D."
and insert -- 3/4 inch O.D.--

Signed and Sealed this

Seventeenth Day of November, 1992

Attest:

DOUGLAS B. COMER

*Attesting Officer*      *Acting Commissioner of Patents and Trademarks*